United States Patent
Benedix et al.

(10) Patent No.: US 6,895,538 B2
(45) Date of Patent: May 17, 2005

(54) METHOD FOR TESTING A DEVICE AND A TEST CONFIGURATION INCLUDING A DEVICE WITH A TEST MEMORY

(75) Inventors: Alexander Benedix, München (DE); Henning Hartmann, Oberhaching (DE); Reinhard Düregger, Poing (DE); Wolfgang Ruf, Friedberg (DE)

(73) Assignee: Infineon Technologies AG, Munich (DE)

( * ) Notice: Subject to any disclaimer, the term of this patent is extended or adjusted under 35 U.S.C. 154(b) by 525 days.

(21) Appl. No.: 09/907,694

(22) Filed: Jul. 18, 2001

(65) Prior Publication Data

US 2004/0015313 A1 Jan. 22, 2004

(30) Foreign Application Priority Data

Jul. 18, 2000 (DE) .......................................... 100 34 878

(51) Int. Cl.[7] .............................................. G11C 29/00
(52) U.S. Cl. ........................................ 714/723; 365/201
(58) Field of Search .................................. 714/718, 723; 365/201

(56) References Cited

U.S. PATENT DOCUMENTS

| 5,289,113 | A | | 2/1994 | Meaney et al. |
| 6,115,828 | A | * | 9/2000 | Tsutsumi et al. ............... 714/7 |
| 6,130,442 | A | * | 10/2000 | Di Zenzo et al. ............. 257/48 |
| 6,256,756 | B1 | * | 7/2001 | Faulk, Jr. ..................... 714/718 |
| 6,330,693 | B1 | * | 12/2001 | Lindsay ........................ 714/42 |
| 6,467,054 | B1 | * | 10/2002 | Lenny .......................... 714/42 |
| 6,477,672 | B1 | * | 11/2002 | Satoh .......................... 714/721 |
| 6,622,269 | B1 | * | 9/2003 | Ngo et al. ................... 714/718 |
| 6,651,202 | B1 | * | 11/2003 | Phan ........................... 714/733 |

FOREIGN PATENT DOCUMENTS

DE          197 23 262 A1     4/1998

* cited by examiner

*Primary Examiner*—Albert Decady
*Assistant Examiner*—Cynthia Britt
(74) *Attorney, Agent, or Firm*—Laurence A. Greenberg; Werner H. Stemer; Ralph E. Locher

(57) ABSTRACT

A test configuration that includes a device and a method for testing the device in which test results determined during the testing of the device are stored in a memory in the device. In this way, the test results are connected with the device and available at any time for later evaluations.

12 Claims, 2 Drawing Sheets

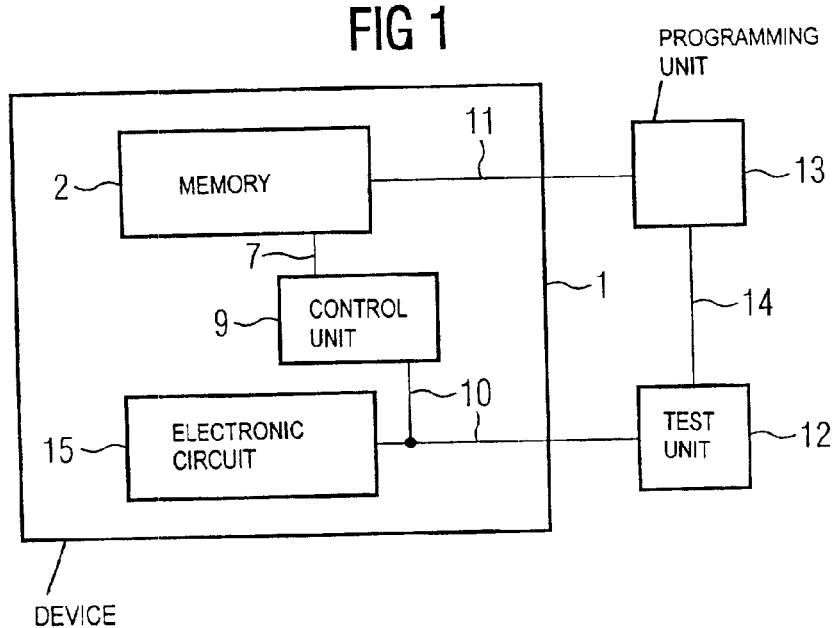
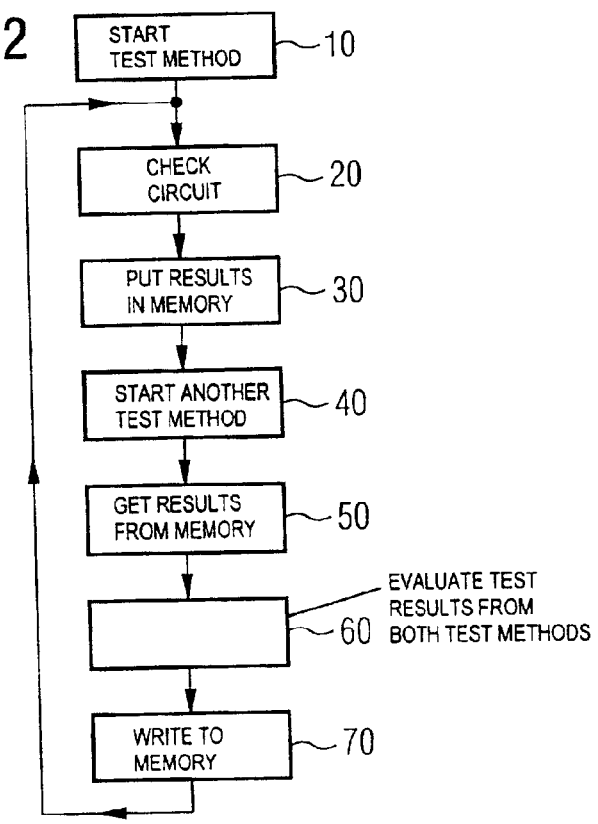

METHOD FOR TESTING A DEVICE AND A TEST CONFIGURATION INCLUDING A DEVICE WITH A TEST MEMORY

BACKGROUND OF THE INVENTION

Field of the Invention

The invention relates to a method for testing a device and to a test configuration including a device to be tested.

Devices are tested with regard to a predetermined mode of operation during various stages of production. To that end, in the case of a semiconductor memory, for example, a test unit is used to test that the memory cells have a correct mode of operation.

Depending on the current stage of production of the device, different test methods are used for testing the device. Usually, the test results of the test methods are used to remove defective devices by sorting or to classify devices into different quality classes.

SUMMARY OF THE INVENTION

It is accordingly an object of the invention to provide a method and a test configuration including a device that enables improved utilization of the test results.

With the foregoing and other objects in view there is provided, in accordance with the invention a method for testing a device, which includes: using a test method to test a device and to determine test results; and storing the test results in a memory in the device.

Because the test results are stored in the memory in the device and are permanently connected with the device, the test results can be read out later, for example after a further production step, and can be taken into account for the performance of the production step.

In accordance with an added feature of the invention, not only the test results, but also an identifier for the test method with which the test results were determined are stored in the memory. In this way, it is possible to store test results from a multiplicity of test methods for later evaluation and/or use. Because of the identifier, the test results are assigned to the individual test methods. This information can be taken into account during evaluation and can provide details about the causes of a malfunction.

In accordance with another feature of the invention, the invention is applied to the field of semiconductor memories, in which electrically programmable, nonvolatile memories are preferably used as the memory. The invention is used particularly advantageously in DRAMs (Dynamic random Access Memories), which constitute dynamic memories in which the individual memory cells of the memory can be accessed. An array of programmable fuses is preferably used as the memory.

In accordance with a further feature of the invention, the stored test results are read out and evaluated according to predetermined methods. Preferably, the stored test results are taken into account during subsequent test methods in order e.g. to remove defective modules by sorting or to classify good modules into different quality classes.

With the foregoing and other objects in view there is provided, in accordance with the invention a test configuration, that includes: a test unit for performing testing according to a predetermined test method; a programming unit; and a device. The device includes: a memory; and an input/output interface for performing an operation selected from the group consisting of writing data to the memory and reading data from the memory. The interface enables connection of the test unit thereto such that the test unit can test the device according to the predetermined test method. The interface is also designed for connecting the programming unit thereto. The programming unit is configured for writing test results to the memory of the device.

In accordance with a further feature of the invention, the memory is an electrically programmable nonvolatile memory.

In accordance with a further added feature of the invention, the memory of the device stores data selected from the group consisting of the test results and a quality class that was determined during the testing of the device.

In accordance with a concomitant feature of the invention, the programming unit is integrated on the device.

Other features which are considered as characteristic for the invention are set forth in the appended claims.

Although the invention is illustrated and described herein as embodied in a method for testing a device, and device with test memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a device with a test unit and a programming unit;

FIG. 2 shows a program sequence for the testing of a device; and

DESCRIPTION OF THE PREFERRED EMBODIMENTS

Figure 3:
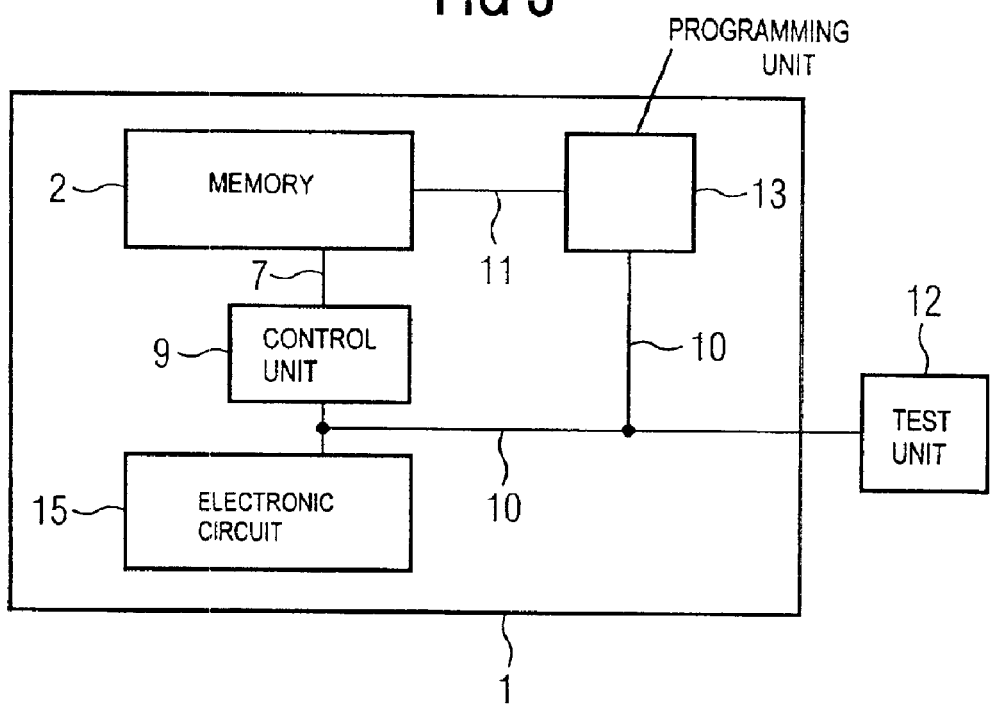
FIG. 3 shows a device with an integrated programming unit.

Referring now to the figures of the drawing in detail and first, particularly, to FIG. 1 thereof, there is shown a device 1 having a memory 2 that is designed in the form of an addressable array of electrically programmable nonvolatile memory cells or electrically programmable fuses. The memory 2 is realized as an electrically programmable memory having a multiplicity of individually addressable memory cells. The memory 2 is connected to a control circuit 9 via an interface 7 (a third interface). The control circuit 9 is integrated on the device 1. In addition, the device 1 has a first interface 10 and a second interface 11, to which a test unit 12 and a programming unit 13 are connected, respectively. The test unit 12 and the programming unit 13 are connected to one another via a data line 14.

The second interface 11 connects the memory 2 and the programming unit 13. The memory 2 is designed as a programmable read-only memory, for example, to whose memory cells, data can be written by blowing a fuse at the output of the memory cell by means of an elevated programming current.

The device 1 has an electronic circuit 15, which is connected to the control circuit 9 and the test unit 12 via the first interface 10. The test unit 12 has access to the electronic circuit 15 via the first interface 10 and tests the electronic circuit 15 according to predetermined test methods. The test results obtained during the testing of the electronic circuit 15 are forwarded to the programming unit 13. The programming unit 13 transmits the test results into the programmable memory 2 via the second interface 11. In a development of the invention, instead of the first and second interfaces 10, 11, only one interface is provided, to which the control circuit 9, the electronic circuit 15, the memory 2, the test unit 12 and the programming unit 13 are connected.

The device 1 has not been described in every detail and can be designed as a DRAM, for example. However, the device 1 can also have any other electronic circuits which are tested with regard to a correct mode of operation.

In a preferred embodiment, the programming unit 13 is integrated on the device 1, as is illustrated in FIG. 3.

The mode of operation of the arrangement of FIG. 1 is explained in more detail below with reference to the program sequence in FIG. 2:

At program point 10, the test unit 12 starts a test method, in the course of which the electronic circuit 15 is tested. If the electronic circuit 15 is designed for example in the form of a memory with a multiplicity of memory cells, then the individual memory cells are tested with regard to a correct mode of operation. To that end, the test unit 12 passes predetermined data to the electronic circuit 15 for storage.

Afterward, at program point 20, the test unit 12 checks whether the transmitted data were stored correctly by the memory cells, how quickly the circuit 15 operates and the current consumption of the circuit 15. In this case, information regarding correct or incorrect storage and/or classification into a quality class (high, medium, low) with regard to the speed, the correct mode of operation and/or the current consumption is determined as a test result. The test results are transmitted to the programming unit 13.

At the subsequent program point 30, the programming unit 13 transmits the test results into the programmable memory 2 via the second interface 11. In a preferred embodiment, in addition to the test results, an identifier for the test method with which the test results were determined is stored in the memory 2. In this way, the test results of different test methods can be stored in the memory 2 in a manner ordered according to the test methods. This provides an advantage in that the test methods can be taken into account when test results are evaluated and/or used.

At the subsequent program point 40, the test unit 12 starts another test method. In the course of the started test method, for example, in a later production stage or at a different ambient temperature, the same function or a different function of the electronic circuit 15 is tested. By way of example, the clock frequency of the electronic circuit 15 is tested at a different temperature.

At program point 50, the test unit 12 reads out the test results stored in the memory 2.

At the subsequent program point 60, the test unit 12 evaluates the test results read out and evaluates the new test results and assigns the electronic circuit to a quality class (e.g. low, medium, high). By way of example, if the stored test results were determined during a low-temperature test at −10°, for example, and, during the subsequent test, the high temperature strength of the electronic circuit 15 was tested at a temperature of 85° C., then the test results of the two tests are used in order to classify the electronic circuit 15 into a quality class for the two temperatures and into a quality class independently of the temperature.

Afterward, the programming unit 13 writes the test results and/or the quality classes for the temperatures and/or the quality class for the electronic circuit 15 independently of the temperature to the memory 2 at program point 70. The program then branches back to program point 20.

The invention has been described using the example of an electronically programmable memory 2 with preferably electronic fuses. However, the invention is not restricted to this memory, rather it is possible to use any kind of memory for storing the test results.

One advantage of the invention is that the test results are present in a structural unit with the tested device and are thus available at the device throughout the service life of the device. This provides extended utilization of the information contained in the test results. This information can be used in DRAMs e.g. to test the degradation (aging) of cells or transistors during the operating time.

FIG. 3 shows a further embodiment of the invention, in which the programming unit 13 is integrated on the device 1 and is connected to the test unit 12 via the first interface 10.

We claim:

1. A method for testing a semiconductor memory, which comprises:

providing the semiconductor memory with a nonvolatile memory and a multiplicity of individual memory cells;

using a test method to test the semiconductor memory and to determine test results, and for testing the individual memory cells with regard to a correct operation mode;

storing the test results in the nonvolatile memory in the semiconductor memory to make the test results available to the semiconductor memory throughout the service life of the semiconductor memory; and storing an identifier in the nonvolatile memory to indicate the test method used to determine the test results.

2. The method according to claim 1, which comprises:

providing the nonvolatile memory as an electrically programmable nonvolatile memory.

3. The method according to claim 1, which comprises reading out and evaluating the stored test results.

4. The method according to claim 1, which comprises:

defining the test method as a first test method;

utilizing the test results from the first test method in a second test method;

rating a plurality of test results in a form of a quality class; and storing the plurality of the test results.

5. The method according to claim 1, wherein the semiconductor memory is a DRAM.

6. A test configuration, comprising:

a test unit for performing testing according to a predetermined test method;

a programming unit; and a semiconductor memory including:

a multiplicity of individual memory cells;

a nonvolatile memory; and an input/output interface for performing an operation selected from the group consisting of writing data to said nonvolatile memory and reading data from said nonvolatile memory, said interface enabling connection of said test unit thereto such that said test unit can test said semiconductor memory according to the predetermined test method, for testing the individual memory cells with regard to a correct operation mode;

said interface also configured for connecting said programming unit thereto;

said programming unit configured for writing test results to said nonvolatile memory of said semiconductor memory, to store an identifier in said nonvolatile memory for indicating the test method used, thus making the test results available to the semiconductor memory throughout the service life of the semiconductor memory.

7. The test configuration according to claim 6, wherein said nonvolatile memory is an electrically programmable nonvolatile memory.

8. The test configuration according to claim 7, wherein said nonvolatile memory of said semiconductor memory stores data selected from the group consisting of the test results and a quality class determined during the testing of said semiconductor memory.

9. The test configuration according to claim 6, wherein said nonvolatile memory of said semiconductor memory stores data selected from the group consisting of the test results and a quality class determined during the testing of said semiconductor memory.

10. The test configuration according to claim 6, wherein said programming unit is integrated on said semiconductor memory.

11. The test configuration according to claim 6, wherein said semiconductor memory is a DRAM.

12. A method for testing a semiconductor memory, which comprises:

providing the semiconductor memory with a nonvolatile memory;

using a test method to test the semiconductor memory and to determine test results;

storing the test results in the nonvolatile memory in the semiconductor memory;

storing an identifier in the nonvolatile memory to indicate the test method used to determine the test results;

defining the test method as a first test method;

utilizing the test results from the first test method in a second test method;

rating a plurality of test results in a form of a quality class; and storing the plurality of the test results.

\* \* \* \* \*